United States Patent [19]
Dinteman et al.

[11] Patent Number: 6,057,716
[45] Date of Patent: May 2, 2000

[54] INHIBITABLE CONTINUOUSLY-TERMINATED DIFFERENTIAL DRIVE CIRCUIT FOR AN INTEGRATED CIRCUIT TESTER

[75] Inventors: Bryan J. Dinteman, Canby; Paul Dana Wohlfarth, Vernonia, both of Oreg.

[73] Assignee: Credence Systems Corporation, Fremont, Calif.

[21] Appl. No.: 09/295,632

[22] Filed: Apr. 20, 1999

Related U.S. Application Data

[62] Division of application No. 09/056,543, Apr. 7, 1998.

[51] Int. Cl.[7] .................................................. H03B 1/00
[52] U.S. Cl. ........................... 327/108; 327/563; 326/30; 326/90
[58] Field of Search ..................................... 327/563, 108, 327/109, 110, 111, 112, 561, 562; 326/30, 56, 57, 58, 59, 86, 90

[56] References Cited

U.S. PATENT DOCUMENTS 5,767,698  9/1998  Emeigh et al. ............................ 326/83

*Primary Examiner*—Timothy P. Callahan
*Assistant Examiner*—Jeffrey Zweizig
*Attorney, Agent, or Firm*—Smith-Hill and Bedell

[57] ABSTRACT

A drive circuit for an integrated circuit tester operates in either a drive mode of a termination mode. In the drive mode, the drive circuit supplies a differential test signal to an integrated circuit device under test (DUT) via a pair of transmission lines. In its termination mode, the drive circuit terminates the transmission lines with their characteristic impedances and provides an adjustable load to a DUT output signal appearing on the transmission lines.

3 Claims, 4 Drawing Sheets

6,057,716

INHIBITABLE CONTINUOUSLY-TERMINATED DIFFERENTIAL DRIVE CIRCUIT FOR AN INTEGRATED CIRCUIT TESTER

This appln is a Divisional of Ser. No. 09/056,543 filed Apr. 7, 1998.

BACKGROUND OF THE INVENTION

1. Field of the Invention

The present invention relates in general to a drive circuit for an integrated circuit tester for providing a differential test signal and in particular to an inhibitable, continuously-terminated, differential drive circuit.

2. Description of Related Art

An integrated circuit (IC) tester tests switching speed and propagation delay times of an IC by transmitting a sequence of test signals to input/output (I/O) pins or terminals of the IC device under test (DUT) and measuring the timing and logic levels of output signals the DUT produces in response to the test signals. A typical integrated circuit tester includes a set of "pin electronics" circuits, one connected to each pin or terminal of the DUT. Each pin electronics circuit is capable of either sending a single-ended test signal to the DUT pin or of sampling a single-ended DUT output signal produced at the pin to determine the output signal's logic state. In order to measure response times of a DUT with a high degree of accuracy a pin electronics circuit should be able to produce a test signal with accurately timed edges. When the pin electronics circuit is sampling a DUT output signal, the drive circuit within the pin electronics that generates the test signal is turned off and put into a high-impedance state (tristated).

Each pin electronics circuit is connected to a DUT pin through a transmission line which should convey the test and DUT response signals between the pin electronics circuit and the DUT pin with as little distortion as possible. To limit transmission line distortion when the pin electronics circuit is sampling the DUT output signal, the transmission line is terminated at its pin electronics circuit end by the transmission line's characteristic impedance.

Since most integrated circuits use single-ended input and output signals, IC testers typically employ pin electronics circuits producing single-ended test signals. When a DUT requires a differential signal input, an IC tester typically employs two pin electronics circuits operating 180 degrees out of phase with one another to provide a "pseudo-differential" test signal simulating a true differential test signal. However it is difficult to match the phase of the two pin electronics circuits so that edges in the signals produced by the two pin electronics circuits precisely coincide. It is also difficult to precisely match the slew rates of the two signals to ensure that crossing occurs at the correct voltage level. As signal frequencies increase, timing errors resulting from small mismatches in behavior of the two signals forming a pseudo-differential test signal become increasingly significant.

To avoid problems associated with pseudo-differential test signals, it would be desirable to employ pin electronics circuits providing true differential test signals when testing ICs having differential signal inputs. Although differential drivers are well-known and commonly employed in the electronics industry, they have not typically employed in IC tester pin electronics circuits because it is difficult to quickly switch a differential driver to a high impedance state when the pin electronics circuit is sampling a DUT output signal instead of producing a test signal. It is possible to use a transistor or relay switch to isolate a driver from the transmission lines, but transistor switches can distort the test signal and relay switches are too slow to be used in high speed testing.

When the pin electronics circuit is receiving and sampling a DUT output signal, a transmission line should deliver the DUT output signal to the pin electronics circuit with as little distortion as possible. To help minimize signal distortion, the transmission line should be terminated at the pin electronics circuit with the transmission line's characteristic impedance. What is needed is a drive circuit that can produce a true differential test signal when needed but which provides proper transmission line terminating impedance and when the transmission line is conveying a DUT output signal.

SUMMARY OF THE INVENTION

The present invention relates a drive circuit for an integrated circuit (IC) tester. In accordance with one aspect of the invention the drive circuit has two modes of operation: drive and termination. In the drive mode of operation, the drive circuit transmits a differential test signal to terminals of an integrated circuit device under test (DUT) through a matching pair of transmission lines. When the same pair of transmission lines are used to convey a DUT output signal back to the IC tester, the drive circuit operating in its termination mode provides proper termination for the transmission line and provides proper loading for the DUT output signal. With the load at the tester end of each transmission line properly adjusted, the DUT is able to produce its output signal under its specified load conditions.

In accordance with another aspect of the invention, in a preferred embodiment thereof, the drive circuit includes a digital-to-analog converter (DAC) for placing an adjustable supply voltage on a circuit node, a pair of transistors, and a pair of resistors, each having the characteristic impedance of the transmission lines. Each resistor links a separate transmission line and a load terminal of a separate one of the transistors to the circuit node. The drive circuit also includes an adjustable current source having two current outputs, each providing a load current through a separate one of the transistors. In the drive circuit's differential mode of operation, the current source provides a load current in common to both transistors so that the drive circuit behaves as a conventional driver in which an input differential DRIVE signal controls the proportion of the load current passing through each transistor, thereby controlling the state of the drive circuit's output TEST signal appearing on the transmission lines connected to the transistor's load terminals.

When the drive circuit operates in its termination mode, both transistors are connected to a current source and turned on. Each transistor pulls a transmission line connected to its load terminal to a voltage level determined by the magnitude of the load current provided by the current source. The load current may be adjusted so that voltage level on each transmission line matches the specified load voltage for the DUT when the DUT is producing an output signal.

It is accordingly an object of the invention to provide a drive circuit for an IC tester that, when in a drive mode, can place a differential test signal on a pair of transmissions for transmission to a DUT, and which, when the DUT is transmitting an output signal to the tester via the transmission lines, can operate in a termination mode providing appropriate terminating impedances to appropriate voltages for the transmission lines and device output circuit characteristics.

It is also an object of the invention to provide a drive circuit that can switch quickly between its drive and termination modes with minimal noise in the output signal.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates in combined block and schematic diagram form a pin electronics circuit for an integrated circuit tester including a drive circuit in accordance with a first embodiment of the present invention, FIG. 2 illustrates in combined block and schematic diagram form a drive circuit in accordance with a second embodiment of the present invention, FIG. 3 illustrates in combined block and schematic diagram form a drive circuit in accordance with a third embodiment of the present invention, and FIG. 4 illustrates in combined block and schematic diagram form a drive circuit in accordance with a fourth embodiment of the present invention.

DESCRIPTION OF THE PREFERRED EMBODIMENT(S)

Figure 1:
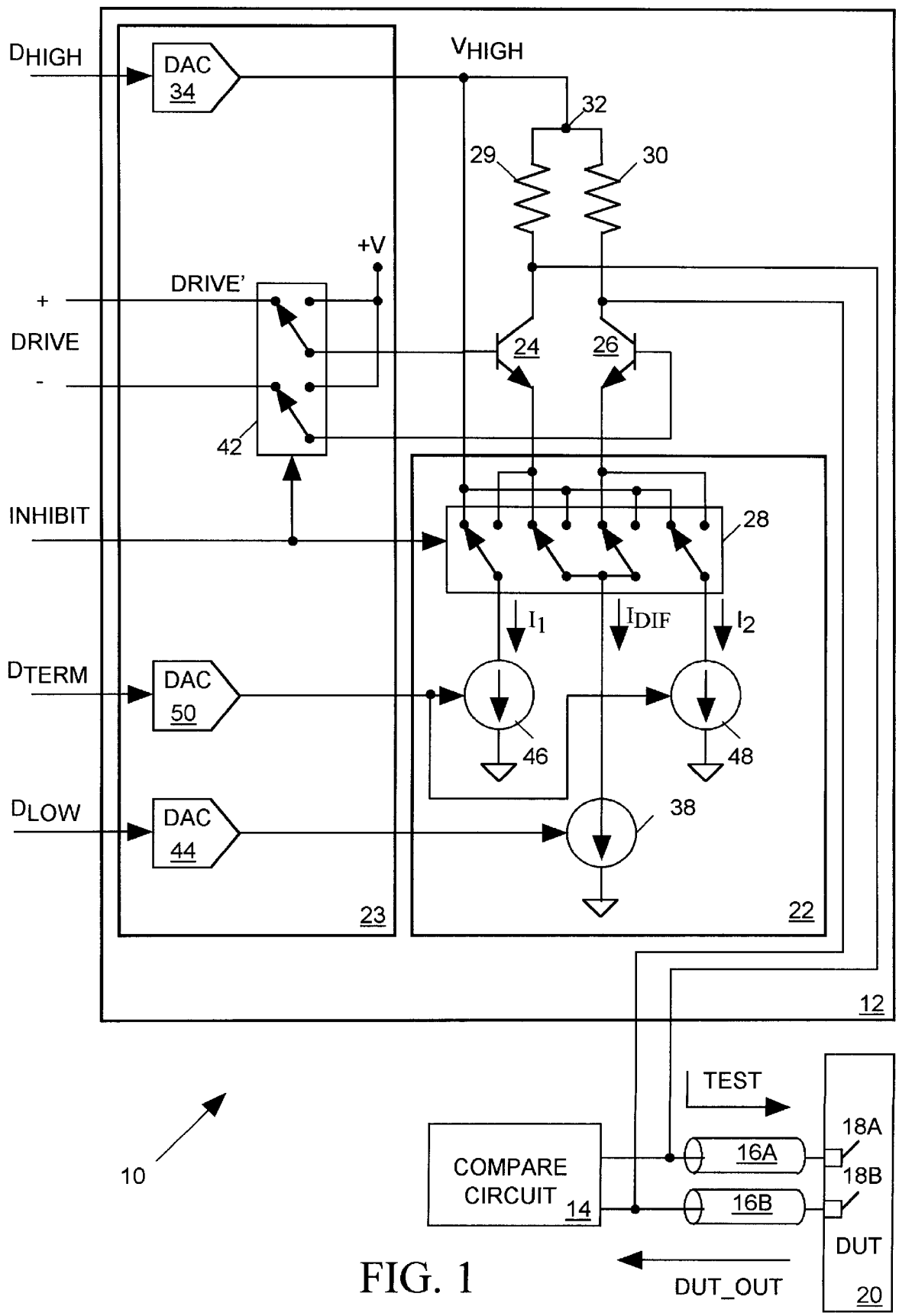

FIG. 1 illustrates in combined block and schematic diagram form, a pin electronics circuit 10 for an integrated circuit tester. Pin electronics circuit 10 includes a drive circuit 12 in accordance with a first embodiment of the present invention and a conventional compare circuit 14. In accordance with the present invention, drive circuit 12 is capable of operating in either of two modes. When an input INHIBIT data bit is low, drive circuit 12 enters a "drive" mode of operation in which it produces an output differential test signal (TEST) of a state determined the state of an input differential DRIVE signal. A pair of transmission lines 16A and 16B deliver the TEST signal to a pair of input/output (I/O) terminals 18A and 18B of an integrated circuit device under test (DUT) 20. The high and low levels of the differential TEST signal are set by input data $D_{HIGH}$ and $D_{LOW}$.

When the INHIBIT bit is high, drive circuit 12 enters a "termination" mode of operation. In this mode of operation, while comparing circuit 14 samples the state of a differential output signal DUT_OUT produced by the DUT 20 on transmission lines 16A and 16B, drive circuit 12 terminates transmission lines 16A and 16B with their characteristic impedances and provides an adjustable load voltage to the DUT_OUT signal. Input data $D_{TERM}$ sets the magnitude of that adjustable load. Current Source Switching Drive Circuit Drive circuit 12 of FIG. 1 includes an adjustable current source 22, a controller 23, a pair of NPN bipolar transistors 24 and 26 and a pair of resistors 29 and 30. Transmission line 16A is connected to the load terminal (collector) of transistor 24 and transmission line 16B is connected to the collector of transistor 26. Resistors 29 and 30 link load terminals (collectors) of transistors 24 and 26, respectively, to a node 32. Current source 22 draws currents from the emitters of transistors 24 and 26. Controller 23 receives input control data and signals ($D_{HIGH}$, DRIVE, INHIBIT, $D_{TERM}$, and $D_{LOW}$) from an external source and supplies input control signals to current source 22 and transistors 24 and 26. Controller 23 also includes digital-to-analog converter (DAC) 34 driven by the input $D_{HIGH}$ data provides an output voltage $V_{HIGH}$ at node 32.

Adjustable current source 22 includes a set of three current sources 38, 46 and 48 and a switch 28 controlled by the INHIBIT data for selectively connecting each current source 38, 46, and 48 either to an emitter of a transistors 24 or 26 or to node 32. The INHIBIT data bit is set false when drive circuit 12 operating in the drive mode, providing a differential TEST signal input to DUT 20. When the INHIBIT data is false, switch 28 connects the emitters of transistors 24 and 26 to a current source 38 while a switch 42 within controller 23, also controlled by the INHIBIT data bit, connects the input differential DRIVE signal across the control terminals (bases) of transistors 24 and 26. Then the DRIVE signal is a logical "1", the emitter of transistor 24 is driven high and the emitter of transistor 26 is driven low. Transistor 24 turns on and transistor 26 turns off. Current source 38 then draws a load current $I_{DIFF}$ from node 32 via resistor 29 and transistor 24, thereby pulling transmission line 16A to a low voltage level $V_{LOW}$ and allowing transmission line 16B to rise to the high voltage level $V_{HIGH}$. This sets the TEST signal input to DUT 20 to a logical "1". Conversely, when the DRIVE signal is a logical "0", the emitter of transistor 26 goes high and the emitter of transistor 24 goes low. Transistor 26 turns on, transistor 24 turns off and current source 38 draws its load current $I_{DIFF}$ from node 32 via resistor 30 and transistor 26. Transmission line 16A is driven to the high voltage level $V_{HIGH}$ and transmission line 16B is driven to the low level $V_{LOW}$. This sets the TEST signal input to DUT 20 to a logical "0". The output voltage of a DAC 44 driven by the input $D_{LOW}$ data controls the magnitude of current $I_{DIF}$ drawn by current source 38. The magnitude of the low differential voltage level $V_{LOW}$ is equal to $V_{HIGH}-I_{DIF}R$, where R is the matching resistance of each resistor 29 and 30. Thus the nature of the differential TEST signal can be adjusted to suit the input signal requirements of DUT 20 by setting the TEST signal high voltage $V_{HIGH}$ via input data $D_{HIGH}$ and then setting the TEST signal low differential voltage $V_{LOW}$ via input data $D_{LOW}$.

The INHIBIT data bit is set true to place drive circuit 12 in its terminate mode when DUT 20 is producing an output signal DUT_OUT. When INHIBIT is true, switch 28 connects the emitters of transistors 24 and 26 to current sources 46 and 48, respectively, and switch 42 connects a positive voltage source +V to the bases of transistors 24 and 26 to turn them both on. Current source 46 draws a load current $I_1$ from node 32 via resistor 29 and transistor 24. Current source 48 draws a load current $I_2$ from node 32 via resistor 30 and transistor 2. The magnitudes of I1 and I2 are similar and are controlled by the output voltage of a DAC 50 driven by the $D_{TERM}$ input data. When switch 28 is not connecting any of current sources 38, 46 or 48 to the emitter of a transistor 24 or 26, it connects that current source to node 32.

Transmission lines 16A and 16B have matching characteristic impedances $Z_0$, and it is beneficial to terminate transmission lines 16A and 16B with their characteristic impedances $Z_0$ at their compare circuit end. This helps to prevent transmission lines 16A and 16B from distorting DUT_OUT. The resistance R of resistors 29 and 30 is then set to provide the proper transmission line terminating impedance $Z_0$ during terminate mode operation when compare circuit 14 samples the DUT_OUT signal. DUT output signals are normally tested under specified load conditions. The value of $D_{TERM}$ can be adjusted to set load currents $I_1$ and $I_2$ to the specified load for the DUT_OUT signal.

Thus to properly adjust drive circuit 12 for testing a particular DUT 20, we first choose the resistance of resistors 29 and 30 to be equal to the characteristic impedance $Z_0$ of transmission lines 16A and 16B. We then choose input data values $D_{HIGH}$ and $D_{LOW}$ so set the TEST signal high and low levels at their specified values. We then choose the value of the $D_{TERM}$ input data so drive circuit 20 provides currents $I_1$ and $I_2$ on transmission lines 16A and 16B as desired.

Figure 2:
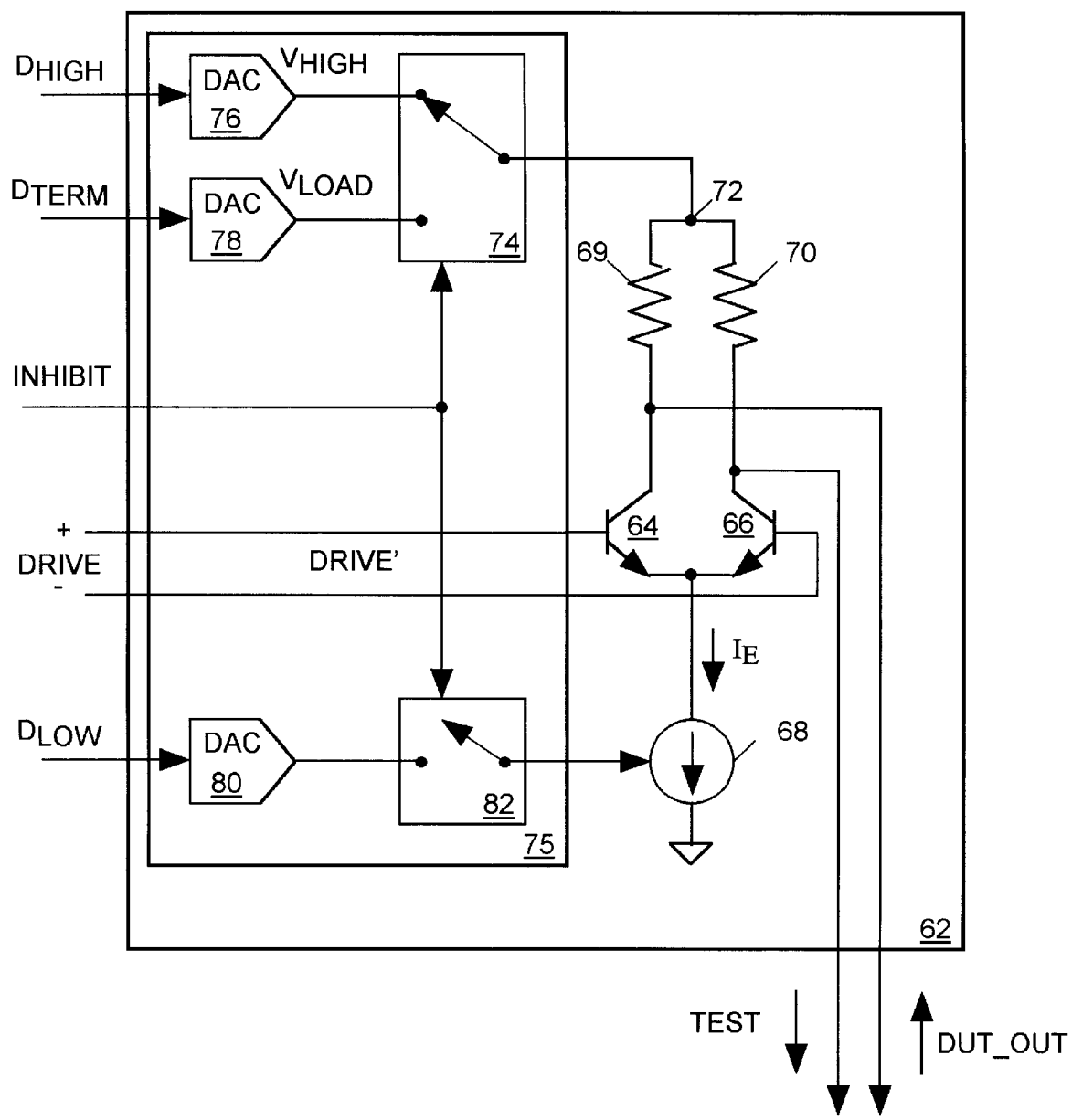

FIG. 2 illustrates in combined block and schematic diagram form a drive circuit 62 in accordance with a second embodiment of the present invention. Drive circuit 62 includes a pair of NPN bipolar transistors 64 and 66 having emitters coupled to ground through an adjustable current source 68. A pair of resistors 69 and 70 link the collectors of transistors 64 and 66 to a node 72. Drive circuit 62 also includes control circuit 75 formed by a set of DACs 76, 78, and 80, and a pair of switches 74 and 82. Input INHIBIT data controls switches 74 and 82. Switch 74 provides either the output voltage $V_{HIGH}$ of DAC 76 or the output voltage $V_{LOAD}$ of DAC 78 to node 72. DAC 80 provides an output voltage signal though switch 82 to current source 68. Input data values $D_{HIGH}$, $D_{TERM}$, and $D_{LOW}$ respectively control the selection of the $V_{HIGH}$, $V_{LOAD}$ and $V_{LOW}$ output voltages of DACs 76, 78 and 80. The differential input signal DRIVE is applied across the bases of transistors 64 and 66.

When drive circuit 62 is to produce its output TEST signal, the INHIBIT data is set so that switch 74 delivers the $V_{HIGH}$ output of DAC 76 to node 72 and so that switch 82 delivers the output of DAC 80 to current source 68. When switch 82 is closed, current source 68 draws a current $I_E$ from the emitters of transistors 64 and 66, and the magnitude of that current is controlled by the magnitude of the output of DAC 80. When the DRIVE signal is of a state for which the differential DRIVE' signal is high at the base of transistor 64 and low at the base of transistor 66, substantially all of emitter current $I_E$ is supplied through resistor 69. The voltage at the collector of transistor 66 rises to a high level (at or near $V_{HIGH}$) and the voltage at the collector of transistor 64 falls to a low level that is determined by the magnitudes of $V_{HIGH}$ and $I_E$ and the fixed impedance R of resistor 69. When the DRIVE input signal changes state, substantially all of emitter current $I_E$ is supplied through resistor 70. The voltage at the collector of transistor 64 rises to the high level and the voltage at the collector of transistor 66 falls to the low logic level. Thus the state of the differential TEST signal, produced across the collectors of transistors 64 and 66, is controlled by the state of the input DRIVE signal. Also the high and low levels of the differential TEST signal are determined by the magnitudes of $V_{HIGH}$ and $I_E$, which are in turn controlled by the values of input data $D_{HIGH}$ and $D_{LOW}$. Since the appropriate high and low TEST signal levels depend on the nature of the device under test, the adjustability of $V_{HIGH}$ and $I_E$ allows DRIVE circuit 62 to be used for testing IC technologies having a wide range of TEST signal specifications.

When drive circuit 62 is not needed to produce the TEST signal the INHIBIT data is set so that switch 74 delivers $V_{LOAD}$ to node 72 and so that switch 82 is open. With switch 82 open, the current $I_E$ drawn by current source 68 falls to zero. This produces a nearly zero current through transistors 64 and 66. The load driven by the DUT output signal DUT_OUT is primarily a function of the impedance of resistors 69 and 70 and the magnitude of $V_{LOAD}$ supplied to node 72. The resistance R of resistors 69 and 70 is selected to match the characteristic impedance of the transmission lines connected to drive circuit 62 so that the transmission lines are properly terminated. The magnitude of $V_{LOAD}$ is adjusted by adjusting the value of input data $D_{TERM}$ to provide appropriate loading for the DUT output signal DUT_OUT.

Thus to properly adjust drive circuit 62 for testing a particular DUT, we first choose the resistance R of resistors 69 and 70 to be equal to the characteristic impedance of the transmission lines connecting the drive circuit to the DUT. We then set the value of the $D_{TERM}$ input data so that the DUT_OUT signal provides a current through resistors 69 and 70 that matches the load specifications for the DUT. We also choose input data $D_{HIGH}$ and $D_{LOW}$ so that the TEST signal high and low levels match specified values for the DUT. (Note that DACs 76 and 78 can be replaced with a single high speed DAC if switch 74 is configured to switch between alternative input data values to the high speed DAC.)

Figure 3:
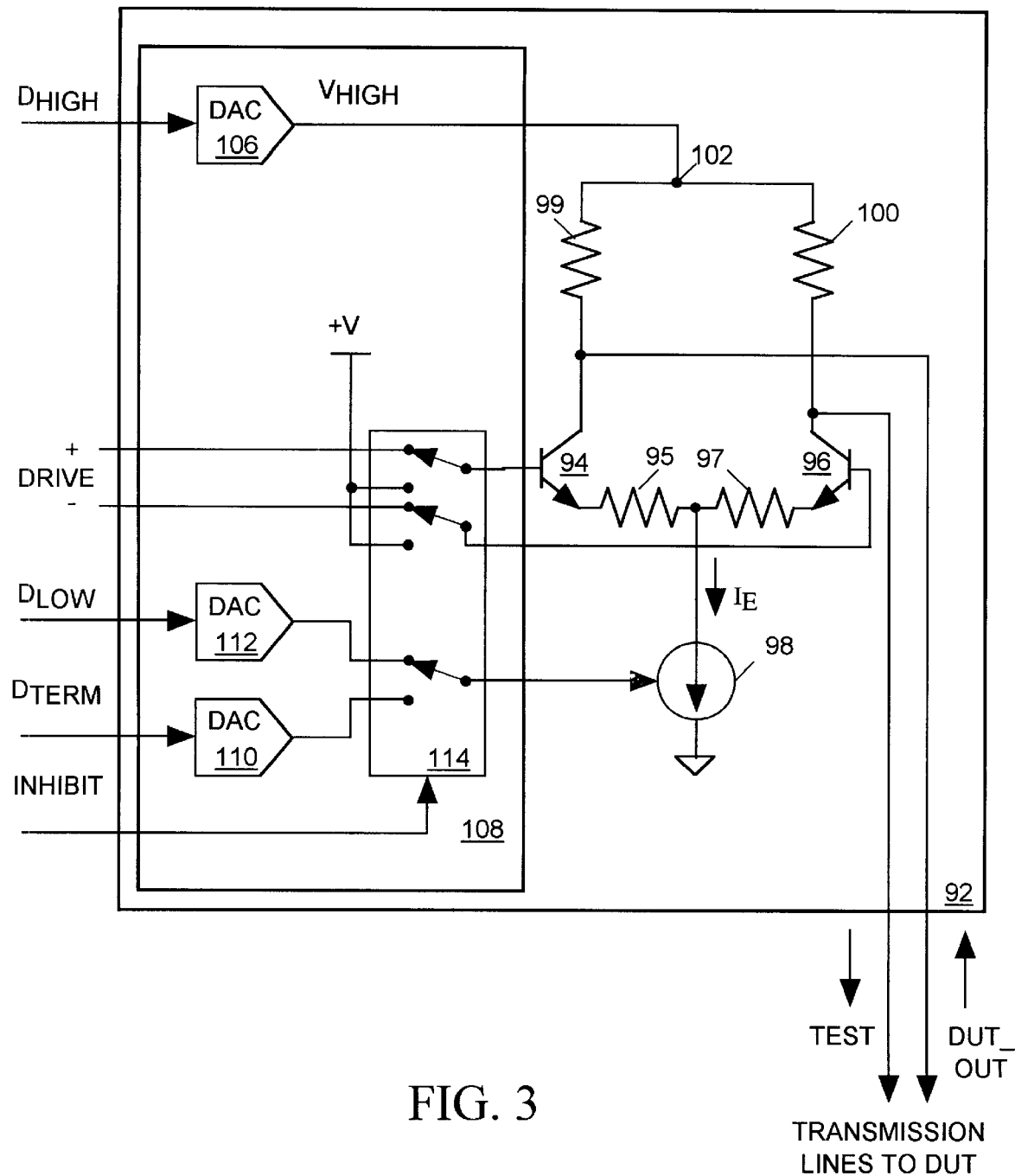

FIG. 3 illustrates in combined block and schematic diagram form a drive circuit 92 in accordance with a third embodiment of the present invention. Drive circuit 92 includes a pair of NPN bipolar transistors 94 and 96 having emitters coupled through a pair of resistors 95 and 97, to adjustable current source 98. A pair of resistors 99 and 100 link the collectors of transistors 94 and 96 to a node 102. Drive circuit 92 also includes control circuit 108 formed by a set of DACs 106, 110 and 112, and a switch 114. The output voltage $V_{HIGH}$ of DAC 106 is supplied to node 102. Current source 98 conducts a current $I_E$ of magnitude determined by an input control signal produced by a selected one of DACs 110 and 112 connected though switch 114 to current source 98. Input data values $D_{HIGH}$, $D_{TERM}$, and $D_{LOW}$ respectively control the output voltages produced by DACs 106, 110 and 112. A differential input signal DRIVE is applied through switch 114 across the bases of transistors 94 and 96.

When drive circuit 92 is to produce its output TEST signal in a drive mode of operation, the INHIBIT data sets switch 114 to deliver the output of DAC 112 to current source 98 and to connect the DRIVE signal across the bases of transistors 94 and 96. Current source 98 draws a current $I_E$ from the emitters of transistors 94 and 96, and the magnitude of that current is proportional to the magnitude of the output of DAC 112. When the DRIVE input signal is of a state for which the differential DRIVE' signal is high at the base of transistor 94 and low at the base of transistor 96, substantially all of emitter current $I_E$ is supplied through resistor 99. The voltage at the collector of transistor 96 rises to a high level (at or near $V_{HIGH}$) and the voltage at the collector of transistor 94 falls to a low level that is determined by the magnitudes of $V_{HIGH}$ and $I_E$ and the fixed impedance R of resistor 99. When the DRIVE input signal changes state, substantially all of emitter current $I_E$ is supplied through resistor 100. The voltage at the collector of transistor 94 rises to the high level and the voltage at the collector of transistor 96 falls to the low level. Thus the state of the differential TEST signal, produced across the collectors of transistors 94 and 96, is controlled by the state of the input DRIVE signal. Also the high and low levels of the differential TEST signal are determined by the magnitudes of $V_{HIGH}$ and $I_E$, which are in turn controlled by the values of input data $D_{HIGH}$ and $D_{LOW}$.

In the termination mode of operation, when drive circuit 92 is not needed to produce the TEST signal, the INHIBIT data is set so that switch 114 connects the bases of transistors 94 and 96 to a positive voltage source (+V) and so that switch 114 connects DAC 110 to current source 98. Thus the current $I_E$ drawn by current source 98 is controlled by the output of DAC 110, which is in turn controlled by the $D_{TERM}$ input data. The load on the DUT output signal DUT_OUT is thus a function of the impedance of resistors 99 and 100 and the magnitude of $D_{TERM}$ and $D_{HIGH}$. The resistance R of resistors 99 and 100 is selected to match the characteristic impedance of the transmission lines connecting drive circuit 92 to the DUT so that the transmission lines are properly terminated. The magnitude of $I_E$ is adjusted by adjusting $D_{TERM}$ to provide appropriate loading for the DUT output signal DUT_OUT. If transistors 94 and 96 and resistors 95 and 97 are balanced, current through resistors 99 and 100 will each equal $I_E/2$ in the termination mode.

Figure 4:
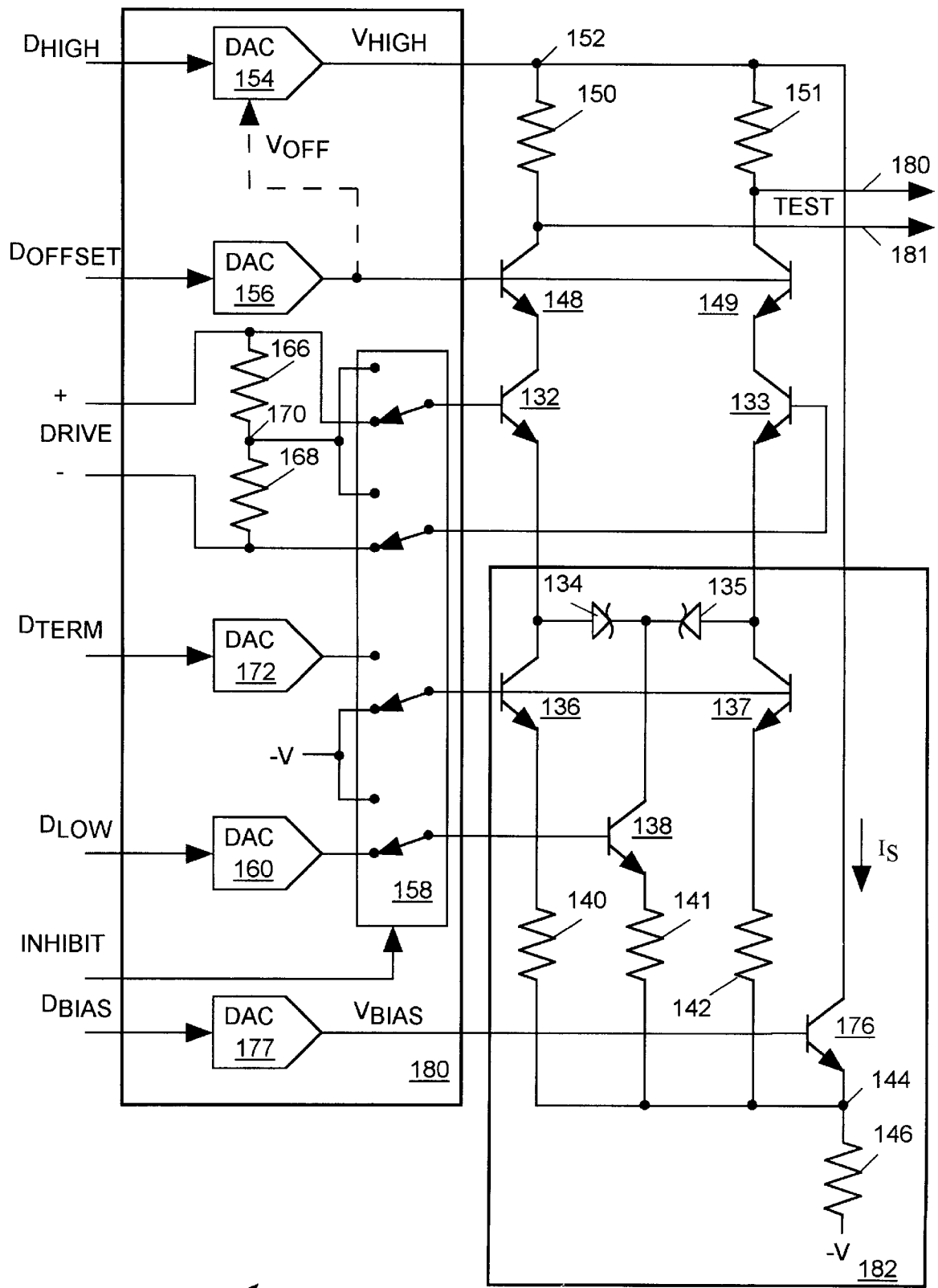

FIG. 4 illustrates in combined block and schematic diagram form a drive circuit 130 in accordance with a fourth embodiment of the present invention. Drive circuit 130 includes NPN transistors 132, 133, 148 and 149, a pair of resistors 150 and 151, a controller 180 and an adjustable current source 182.

Adjustable current source 182 includes three transistors 136, 137 and 138, a set of four resistors 140, 141, 142 and 146, a pair of Schottky diodes 134 and 135. Controller 180 includes a set of five DACs 154, 156, 160, 172, and 177, a switch 158 controlled by input INHIBIT data, and a pair of matching resistors 166 and 168 connected in series. The input differential DRIVE signal is connected across resistors 166 and 168.

The emitter of transistor 132 is connected to the anode of diode 134 and to the collector of transistor 136, Transistor 133 has an emitter connected to the anode of diode 135 and to the collector of transistor 137. Cathodes of diodes 134 and 135 are connected to the collector of transistor 138. Resistors 140, 142 and 141 link the emitters of transistors 136, 137 and 138, respectively, to a circuit node 144. Resistor 146 links node 144 to a negative voltage source -V. Resistors 140 and 142 have matching resistances. The collectors of transistors 132 and 133 are tied to emitters of transistors 148 and 149, respectively, while resistors 150 and 151 respectively couple collectors of transistors 148 and 149 to a circuit node 152. DAC 154, controlled by input data $V_{HIGH}$, supplies a voltage $V_{HIGH}$ to node 152. DAC 156 controlled by input data $D_{OFFSET}$ supplies a control voltage to the bases of transistors 148 and 149.

Output voltage $V_{off}$ DAC 156 can optimally be used to offset DAC 154. One reason for cascode state (transistors 148 and 149 and DAC 156) is that high speed devices typically achieve high speed through reduced geometry, thereby reducing breakdown voltage. The cascode stage allows a small achievable logic swing to be offset to cover a larger common mode range, thus accommodating a much wider set of possible logic family signal potentials, for example, ECL and PECL both have a 1 volt swing but one is centered 4 volts more positive than the other. The cascode stage can optimally be used to offset the small range of high speed transistors to cover greater absolute voltage ranges.

In a drive mode of operation, drive circuit 130 produces a differential output TEST signal on transmission lines 180 and 181 connected to the collectors of transistors 148 and 149. When drive circuit 130 is to operate in its drive mode, the input INHIBIT data sets switch 158 to connect negative voltage source -V to the bases of transistors 136 and 137, to connect the output of DAC 160 to the base of transistor 138, and to connect the differential input signal DRIVE across the bases of transistors 132 and 133. Thus transistors 136 and 137 are off, transistors 138, 148 and 149 are on, and the input DRIVE signal controls the switching states of transistors 132 and 133. When the DRIVE signal is high, transistor 132 is on and transistor 133 is off. Transistor 138 draws a current from node 152 via resistor 150, transistors 148 and 132 and diode 134. The current through resistor 150 pulls the collector of transistor 148 to a low differential logic level controlled by the magnitude of input data $D_{LOW}$ to DAC 160. Since transistor 133 is off, there is little current flow through resistor 151 and the collector of transistor 149 rises to or nearly to $V_{HIGH}$. Thus when DRIVE is high, the output TEST signal is high. When the DRIVE signal is low, transistor 133 is on and transistor 132 is off. Transistor 138 draws a current from node 152 via resistor 151, transistors 149 and 133 and diode 136. The current through resistor 151 pulls the collector of transistor 149 to a low differential logic level. Since transistor 132 is off, the collector of transistor 149 rises to $V_{HIGH}$. Thus when DRIVE is low, the output TEST signal is low.

Input data $D_{OFFSET}$ to DAC 156 controls the voltage of the emitters of transistors 148 and 149. Transistors 148 and 149 act as a cascode stage to isolate TEST signal OUTPUT levels from DRIVE' level. The cascode stage also puts a low impedance at the collectors of transistors 132 and 133 thereby reducing the effects of noise propagating from the DRIVE signal to the TEST signal via the collector-base capacitance of transistor 133. In applications where such isolation or low impedance is not needed, transistors 148 and 149 may be eliminated by connecting resistor 150 directly to the collector of transistor 148 and by connecting resistor 151 directly to the collector of transistor 149. Note that DAC 156 can be replaced with a fixed voltage source if the output switch voltage range is small compared to the transistor's collector-emitter breakdown voltage.

When drive circuit 130 is to operate in a termination mode, it terminates transmission lines 180 and 181 with their characteristic impedances and provides an adjustable load to a differential DUT output signal appearing on transmission lines 180 and 181. To put drive circuit 130 in the termination mode, the INHIBIT data sets switch 158 to connect a node 170 between resistors 166 and 168 to the bases of transistors 132 and 133, to connect the output of DAC 172 driven by input $D_{TERM}$ data to the bases of transistors 136 and 137 and to connect the base of transistor 138 to the -V voltage source to turn transistor 138 off. Switch 158 also connects the bases of transistors 136 and 137 to DAC 172. Node 170, at the common mode voltage of the DRIVE signal, turns on both transistors 132 and 133. Resistors 150 and 151 have resistances matching the characteristic impedances of transmission lines 180 and 181 and therefore terminate the transmission lines with their characteristic impedances. Transistors 136 and 137 draw load currents controlled by input data $D_{TERM}$ through resistors 150 and 151.

DAC 154 has internal source impedance and any change in its load current can affect its output voltage $V_{HIGH}$. It is beneficial to ensure that DAC 154 produces a constant output current. Most of the current passing through resistor 146 originates at DAC 154. If the current through resistor 146 is held constant, then the current output of DAC 154 will be relatively constant regardless of the operating mode of driver 130. The emitter of transistor 176 is connected to node 144, and transistor 176 holds node 144 at a constant voltage level, about 0.7 volts less than the $V_{BIAS}$ output of DAC 177. The input data $D_{BIAS}$ to DAC 177 is suitably set so that $V_{BIAS}$ will allow transistor 176 to regulate at the lowest logic levels required of the TEST signal. Transistor 176 automatically adjusts its output current IS to ensure that node 144 remains at that constant voltage level. Thus transistor 176 acts as a current source compensating for any change in the total current passing though resistors 140–142 as a result of a change in operating mode of driver circuit 130. Since node 144 is held at a constant voltage level, the current through resistor 146 will be held constant and therefore the current output of DAC 154 will be held constant when switch 158 is activated. The value of $V_{BIAS}$ can be adjusted by adjusting the $D_{BIAS}$ input data in order to set the current output of DAC 154 so that DAC 154 provides only the minimum power needed for proper circuit operation for given values of $V_{LOW}$ and $V_{HIGH}$ and termination mode loading. Note that a fixed bias can be used on transistor 176. However in doing so, power will be wasted in transistor 176 when only small output levels are required. DAC 177 (or a switchable voltage source) allows the bias voltage to be adjusted, thereby conserving power. Note also in some applications some or all DACs can be replaced by a switch to a selection of voltages (rails).

While the foregoing specification has described preferred embodiment(s) of the present invention, one skilled in the art may make many modifications to the preferred embodiment without departing from the invention in its broader aspects. For example, while FIGS. 1–4 illustrate drive circuits employing bipolar transistor technology, those skilled in the art will understand the drive circuits can be implemented using other transistor technologies, such as for example MOSFET and JFET. The appended claims therefore are intended to cover all such modifications as fall within the true scope and spirit of the invention.

What is claimed is:

1. A circuit responsive to input control data for alternately operating in one of a drive mode and a termination mode as selected by said input control data, wherein when operating in the drive mode the circuit produces a differential output signal on first and second transmission lines with a logic state of said differential output signal being determined by said input control data, wherein when operating in said termination mode said circuit provides a load for a differential input signal arriving at said circuit on said first and second transmission lines, wherein each of said first and second transmission lines has a similar characteristic impedance, the circuit comprising:

a first circuit node (72);

a first resistor (69) having an impedance matching said characteristic impedance and linking said first transmission line to said first circuit node;

a second resistor (70) having an impedance matching said characteristic impedance and linking said second transmission line to said first circuit node;

current source means (62) for conducting a current;

a first transistor (64) linking said first transmission line and said first resistor to said current source means such that when said first transistor is turned on at least a portion of said current passes from said first circuit node through said first resistor and through said first transistor;

a second transistor (66) linking said second transmission line and said second resistor to said current source means such that when said second transistor is turned on at least a portion of said current passes from said first circuit node through said second resistor and through said second transistor; and control means (75) connected to said current source means for adjusting a magnitude of said current conducted by said current source means in response to said input control data, wherein said control data controls a relative proportion of said current passing through each of said first and second transistors, wherein said current source means conducts said current of magnitude controlled by a magnitude of a control signal, and wherein said control means comprises:

means (80, 82) for generating and applying said control signal to said current source, wherein the magnitude of said control signal is determined by said input control data; and voltage source means (74, 76, 78) for generating and applying a node voltage to said first circuit node, wherein a magnitude of said node voltage is determined by said input control data.

2. The circuit in accordance with claim 1 wherein said voltage source means comprises:

a first digital-to-analog converter (76) for receiving a first portion ($D_{HIGH}$) of said control data and producing an output first voltage ($V_{HIGH}$) of magnitude determined by said first portion of said control data;

a second digital-to-analog converter (78) receiving a second portion ($D_{TERM}$) of said control data and producing an output second voltage ($V_{LOAD}$) of magnitude determined by said second portion of said control data; and switch means (74) controlled by a third portion (INHIBIT) of said control data for applying said first voltage as said node voltage to said first circuit node when said circuit operates in said drive mode and for applying said second voltage source as said node voltage to said first circuit node when said circuit operates in said termination mode.

3. The circuit in accordance with claim 2 wherein when said circuit is operating in said termination mode, said control means sets the magnitude of said current substantially to zero amperes and when said circuit is operating in said drive mode, said control means sets the magnitude of said current to a level substantially greater than zero amperes, said level being determined by said control data.

* * * * *

UNITED STATES PATENT AND TRADEMARK OFFICE
CERTIFICATE OF CORRECTION

PATENT NO. : 6,057,716
DATED : May 2, 2000
INVENTOR(S) : Bryan J. Dinteman and Paul Dana Wohlfarth It is certified that error appears in the above-identified patent and that said Letters Patent is hereby corrected as shown below:

Column 10, line 19 (claim 1, line 45), after "source" should be inserted --means--.

Signed and Sealed this

Sixth Day of March, 2001

NICHOLAS P. GODICI

*Attest:*

*Attesting Officer*     *Acting Director of the United States Patent and Trademark Office*